Figure 1:
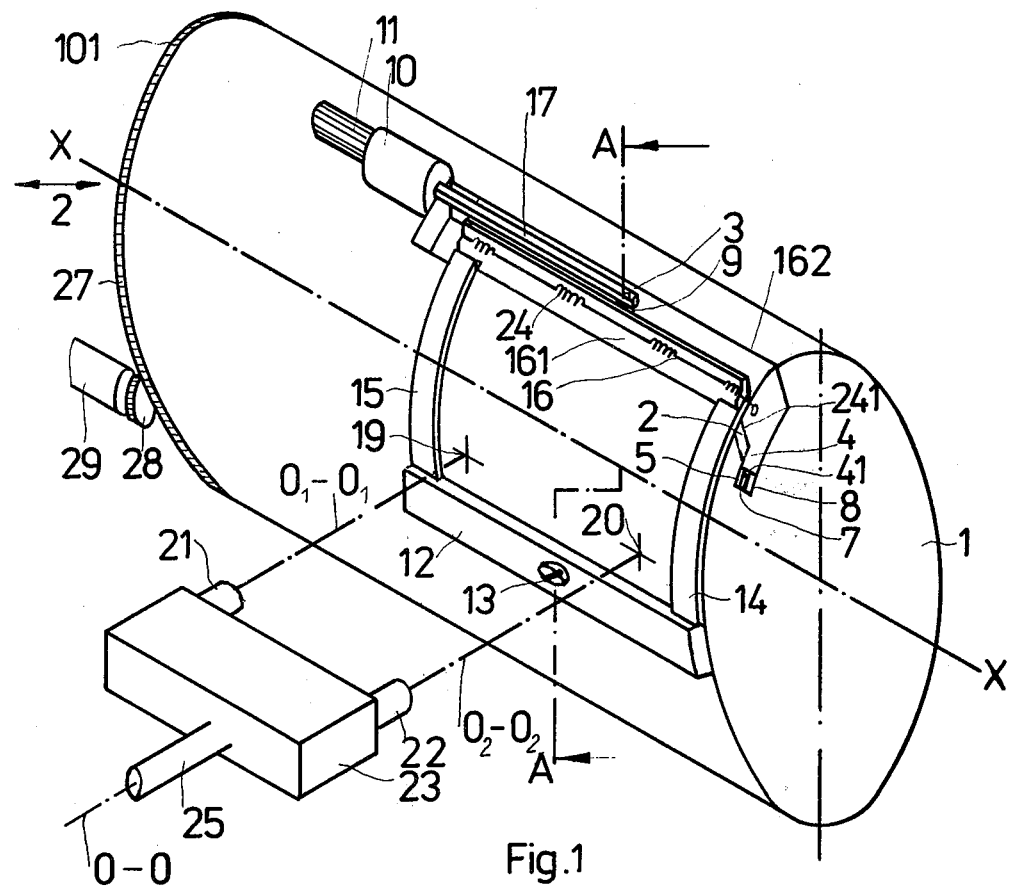

United States Patent [19]

Deter et al.

[11] 4,383,760
[45] May 17, 1983

[54] DEVICE FOR POSITIONING AN OBJECT RELATIVE TO A CARRIER MEANS

[76] Inventors: Christhard Deter, 27, Brehmstra.; Klaus Hiller, 14, E.-Selbmann-Str.; Ulrich Laack, 4/6 Kahlaer Str.; Reiner Leuschner, 17, Otto-Rothe-Str.; Jörg Wünderlich, 10, Freiligrathstr., all of Gera, German Democratic Rep.

[21] Appl. No.: 226,754

[22] Filed: Jan. 19, 1981

[30] Foreign Application Priority Data

Jan. 31, 1980 [DD] German Democratic Rep. ... 218752

[51] Int. Cl.³ .............................................. G01B 11/26
[52] U.S. Cl. .................... 356/150; 33/184.5; 101/DIG. 12; 356/138; 356/401
[58] Field of Search ................. 350/239, 81; 356/138, 356/150, 399–401; 40/361, 509, 49; 250/561; 33/184.5; 101/413, DIG. 12

[56] References Cited

U.S. PATENT DOCUMENTS

| | | | |
|---|---|---|---|
| 2,493,628 | 1/1950 | Harley | 356/150 |
| 2,907,274 | 10/1959 | Taylor | 101/DIG. 12 |
| 4,126,376 | 11/1978 | Gommel et al. | 356/399 |
| 4,259,904 | 4/1981 | Metje | 33/184.5 |

*Primary Examiner*—William H. Punter

[57] ABSTRACT

The invention relates to a device for positioning an object relative to a carrier means, particularly for use in digital image conversion where an object has to be accurately positioned relative to the carrier means. This is achieved by tensioning said object by means of two strips and an elongated member to a mounting piece which moved by a displacement means positions said object. The positioning operation is observed through a measuring microscope.

4 Claims, 2 Drawing Figures

U.S. Patent    May 17, 1983    4,383,760

DEVICE FOR POSITIONING AN OBJECT RELATIVE TO A CARRIER MEANS

This invention relates to a device for positioning an object relative to a carrier means, particularly for use in digital image conversion where an object has to be accurately positioned relative to the carrier means. The Patent specification No. 2504351 of the Federal Republic of Germany discloses a principle according to which an object to be positioned is provided with a set of encoding marks of differing transmissivity and geometry. The informations so encoded are evaluated by a plurality of opto-electronic detectors and electronic circuits.

A projection device compares a standard position relative to the actual positions of said object.

The above device is disadvantageous due to the numerous and complicated electronic components involved.

Furthermore, there are devices known where the carrier means is a cylinder which, however, do not permit a positioning of the object relative to said carrier means.

Since a definite image conversion is not feasible a computer performs corrections required which are time consuming and expensive.

It is an object of the present invention to obviate the above disadvantages.

It is a further object of the present invention to provide a simple device for positioning objects such as films relative to a cylindrical carrier means in a manner to obtain an evaluation of said film in an accurate position required.

It is still a further object to accurately position an object relative to a cylindrical carrier means by a definite movement of the latter.

These and other objects are realised in a device for positioning an object relative to a cylinder surface. The object is tensioned to said cylinder surface by a mounting piece displaceably seated in and, upon said cylinder, by tension strips and an elongated member.

A displacement drive connected to said mounting piece permits an accurate displacement of the object, thus displacing the latter about a point of rotation provided upon the cylinder surface.

The positioning operation is observed through a measuring microscope. The object is displaced about said point of rotation until the required position is achieved which is indicated by reference markings upon the object.

The point of rotation is embodied by a stud rotatable in itself, which can be of cam-shape.

Advantageously the mounting piece abuts against a leading edge of a recess in the cylinder, respectively, surface by force of resilient means.

It is a further advantage when a pin is secured to said mounting piece for connecting the latter to said displacement drive via displacement means.

Figure 2:
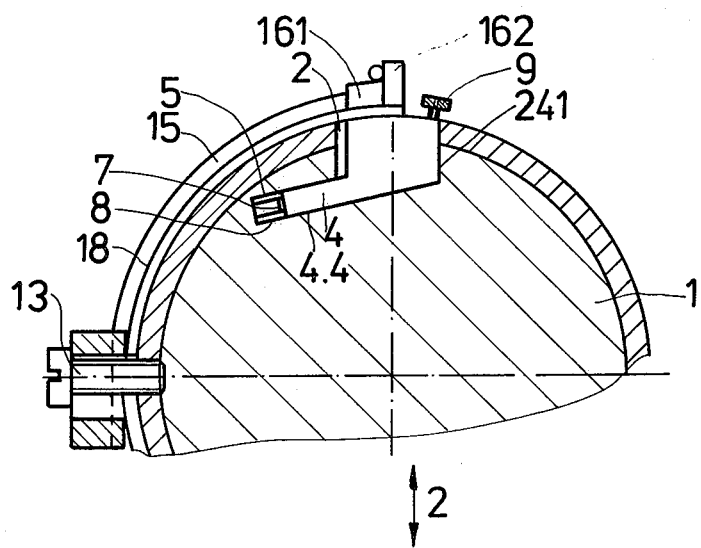

Said displacement means is pivotally hinged to said pin. In order that the invention may be more readily understood reference is made to the accompanying drawings which illustrate diagrammatically and by way of example one embodiment thereof, and where FIG. 1 is a schematical perspective view of a positioning device, and FIG. 2 is a schematic view of a section along A—A of FIG. 1.

A cylinder 1 having a cylinder 101 is rotatable about an axis x—x.

An L-shaped recess 2 is cut into the cylinder 1 and cylinder surface 101, respectively, in parallel to the axis x—x.

A mounting piece 3 also of L-shape fits into said recess 2 with enough tolerance to permit movement of said mounting piece 3 therein. A nose 4 of the mounting piece 3 constituting one arm of the L-shape fits into a groove 5 constituting the other arm of the L-shaped recess 2.

The groove 5 extends substantially in parallel to the axis x—x of the cylinder 1.

Resilient means 8 are provided between a leading edge 41 of the nose 4 and an abutting edge 7 of the groove 5.

The mounting piece 3 carries a pin 9 which projects from the cylinder surface and fits without backlash into one end portion of a rod 17 which via its other end portion is connected to a displacement means 11 in a seating 10 mounted upon the cylinder surface 101 adjacent the one end portion of the recess 2.

The connection between said rod 17 and the pin 9 is detachable.

Substantially in parallel to the recess 2 and at a definite space thereto an elongated member 12 is arranged provided with a central eccentric bore through which by a cam screw 13 said member 12 is displaceably fastened to the cylinder surface 101. The end portions of said elongated member 12 are each connected to the one end portions of two strips 14 and 15, respectively, the other end portions of the latter are secured to an L-shaped bar 16 which is substantially in parallel to the cylinder axis x—x. Said bar 16 is tensioned to the mounting piece 3 by resilient members 24. The end portions of the resilient members 24 are secured to locking bolts 241 (only one visible) of the mounting piece 3.

The bar 16 has a wing 161, which is in overall contact to the mounting piece 3 surface and a wing 162 which stands upright to the surface 101 and at right angles to the wing 161.

The bar 16 is tiltable about the connecting line between the wings 161 and 162 upon the surface of said mounting piece 3 when held by the resilient member 24.

A film 18 is inserted into the surface portion which lies between the mounting piece 3 and the member 12, and is held by the wing 161, the strips 14 and 15 and the member 12.

Reference markings 19, 20 are provided upon the film 18 which are in alignment, when positioned, with the optical axes $O_1$—$O_1$, and $O_2$—$O_2$ of the objectives 21 and 22, respectively, of a measuring microscope 23.

An eyepiece 25 of the microscope 23 has an optical axis O—O.

The cylinder 1 is further provided with a toothed wheel 27 meshing pinion 28 which is mounted upon a driving shaft of a servo-motor 29. In operation the film 18 is inserted between the cylinder surface 101 on the one hand and the strips 14, 15, on the other hand and clamped to the mounting piece 3 by means of the bar 16 and the resilient members 24.

By rotating the cam screw 13 the member 12 is displaced in direction of an arrow 26, and, hence, against the direction of force of the resilient means 8.

Then the cylinder 1 is rotated about the axis x—x by the servo-motor 29, the pinion 28 and the toothed wheel until the reference markings 19, 20 are within the center of the field of view of the measuring microscope 23.

By operating the displacement member 11 the displacement motion is imparted via the rod 17 and the pin 9 attached to the mounting piece 3, to the film 18 clamped via the bar 16 to the mounting piece 3. Said operation is performed until the reference markings 19, 20 are in alignment with the objective axes $O_1$—$O_1$ and $O_2$—$O_2$ of the measuring microscope 23. The such positioned film 18 is scanned by not shown means and the scanning informations are stored in a respective computer.

Then the cam disc 13 is again rotated to relieve the tension of the resilient means 8 and the film 18 is removed from the arrest by either tilting the bar 16 about the connection line between 161 and 162 or by loosening the resilient members 24 at the locking bolts 241.

A new film is inserted in the same manner as described hereinabove and positioned relative to the measuring microscope 23.

Thus the coincidence between the first and the new film is obtained and a scanning of the first film relative to the new one can be performed.

Very accurate positionings can be achieved by a not represented computer control and respective means. The inventional solution is not restricted to the above embodiments.

The resilient means 8 can be embodied as a leaf spring rather than a coil spring as disclosed hereinbefore in connection with the drawings.

The displacement means 11 can be a spindle drive or a rod slideably arranged in a bearing.

Any suitable object other than the film 18 can be investigated in the device.

The cam 13 can be replaced by a suitable number of tension springs secured to the cylinder face 101 on the one hand and to the elongated member 12 on the other hand.

Instead of two objectives 21, 22 of the microscope 23, one objective can be used provided that respective measuring markings in the microscope determine the required position.

Alternatively, the strips 14, 15 can be resilient which renders the resilient means 8 superfluous.

We claim:

1. Device for positioning an object, particulary a photographic film being provided with at least one positioning mark, relative to a surface of a cylinder rotatable about an axis, comprising:
   a recess in said cylinder extending to said surface of said cylinder in parallel to said axis,
   a mounting piece displaceably arranged in said recess in parallel to said axis,
   a seating being arranged at one end of said recess,
   a displacing means for displacing said mounting piece in and along said recess,
   said displacing means being seated in said seating,
   a connecting member having two end portions,
   one end portion being connected to said displacing means,
   the other end portion being connected to said mounting piece,
   a first bar being resiliently connected and substantially in parallel to said mounting piece,
   a second bar being displaceably arranged relative to said cylinder surface and being secured to said cylinder,
   said first bar and said second bar being substantially in parallel to each other in spaced relation,
   two strips being arranged between neighboring end portions of said first and said second bar and being secured thereto,
   said film being tensioned between said first bar and said mounting piece and being arranged between said second bar, said two strips and said cylinder surface,
   drive means for rotating said cylinder about said axis of rotation, and
   a measuring microscope for observing and aligning said reference mark on said film relative to the optical axis of said microscope,
   said measuring microscope being arranged in spaced relation to said cylinder,
   the optical axis of said measuring microscope being substantially at right angles to the axis of rotation.

2. Device as claimed in claim 1,
   wherein resilient means are provided between those adjacent faces of said mounting piece on the one hand and of said recess on the other hand being located beneath said film.

3. Device as claimed in claim 2,
   wherein said recess and said mounting piece are of L-shape each, one arm of said L-shape extending beneath said cylinder surface.

4. Device as claimed in claim 1,
   wherein said first bar is of L-shape, a resilient member being arranged in and along the connection line of the two wings of said L-shape,
   the end portions of said resilient member being connected to said mounting piece, said first bar being tiltable about said connection line on said mounting piece.

* * * * *